(12) United States Patent
Harutyunyan

(10) Patent No.: US 8,093,669 B2
(45) Date of Patent: Jan. 10, 2012

(54) MAGNETIC NANOTRANSISTOR

(75) Inventor: Avetik Harutyunyan, Columbus, OH (US)

(73) Assignee: Honda Motor Co., Ltd., Tokyo (JP)

( * ) Notice: Subject to any disclaimer, the term of this patent is extended or adjusted under 35 U.S.C. 154(b) by 80 days.

(21) Appl. No.: 12/463,557

(22) Filed: May 11, 2009

(65) Prior Publication Data

US 2010/0283090 A1 Nov. 11, 2010

(51) Int. Cl.
*H01L 29/82* (2006.01)
(52) U.S. Cl. .......................... 257/421; 977/936
(58) Field of Classification Search .................. 257/421, 257/427; 977/745, 748, 936, 938; 324/252
See application file for complete search history.

(56) References Cited

U.S. PATENT DOCUMENTS

| | | | |
|---|---|---|---|
| 5,424,054 A | 6/1995 | Bethune et al. | |
| 6,280,697 B1 | 8/2001 | Zhou et al. | |
| 6,809,361 B2 | 10/2004 | Honlein et al. | |
| 6,833,980 B1 * | 12/2004 | Tsukagoshi et al. | 360/324 |
| 6,987,302 B1 | 1/2006 | Chen et al. | |

OTHER PUBLICATIONS

Bethune, D.S. et al., "Cobalt-Catalysed Growth of Carbon Nanotubes With Single-Atomic-Layer Walls,", Nature, Jun. 17, 1993, vol. 363, pp. 605-607.
Harutyunyan, A. R. et al., "CVD Synthesis of Single Wall Carbon Nanotubes Under 'Soft' Conditions,", American Chemical Society, Nano Letters, 2002, vol. 2, No. 5, pp. 525-530.
Iijima, Sumio et al., "Single-Shell Carbon Nanotubes of 1-Nm Diameter," Nature, Jun. 17, 1993, vol. 363, pp. 603-605.
Ivanov, V. et al. "The Study of Carbon Nanotubles Produced by Catalytic Method," Elsevier Science B.V., Chemical Physics Letters, Jun. 24, 1994, vol. 223, pp. 329-335.
Journet, C. et al., "Large-Scale Production of Single-Walled Carbon Nanotubes by the Electric-Arc Technique", Nature, Aug. 21, 1997, vol. 388, pp. 756-758.
Li, W.Z. et al., "Large-Scale Synthesis of Aligned Carbon Nanotubes," Science, Dec. 6, 1996, vol. 274, pp. 1701-1703.
Thess, Andreas et al., "Crystalline Ropes of Metallic Carbon Nanotubes," Science, vol. 273, Jul. 26, 1996, pp. 483-487.
Tsukagoshi et al., "Coherent Transport of Electron Spin in a Ferromagnetically Contacted Carbon Nanotube," Nature 401:572-574 (1999).
PCT International Search Report and Written Opinion, PCT Application No. PCT/US2010/034062, Jul. 9, 2010, five pages.

* cited by examiner

*Primary Examiner* — Mark Prenty
(74) *Attorney, Agent, or Firm* — Fenwick & West LLP; Mark Duell

(57) ABSTRACT

The present invention discloses methods and processes for producing magnetic nanotransistors containing carbon nanotubes. The nanotube is attached to at least one magnetic particle, the nanotube is then placed in between the two fixed magnetic moments, and subjected to an external magnetic field. The current passing through the nanotube can be controlled using the external magnetic field.

22 Claims, 1 Drawing Sheet

MAGNETIC NANOTRANSISTOR

FIELD OF INVENTION

The present invention relates generally to the field of semiconductor devices, and more particularly, to magnetic nanotransistors containing carbon nanotubes and methods of making the same.

BACKGROUND

Carbon nanotubes are hexagonal networks of carbon atoms forming seamless tubes with each end capped with half of a fullerene molecule. (see Iijima et al. Nature 363:603 (1993); Bethune et al., Nature 363: 605 (1993) and U.S. Pat. No. 5,424,054). Presently, there are three main approaches for the synthesis of single- and multi-walled carbon nanotubes. These include the electric arc discharge of graphite rod (Journet et al. Nature 388: 756 (1997)), the laser ablation of carbon (Thess et al. Science 273: 483 (1996)), and the chemical vapor deposition of hydrocarbons (Ivanov et al. Chem. Phys. Lett 223: 329 (1994); Li et al. Science 274: 1701 (1996)). Multi-walled carbon nanotubes can be produced on a commercial scale by catalytic hydrocarbon cracking while single-walled carbon nanotubes are still produced on a gram scale.

Generally, single-walled carbon nanotubes are preferred over multi-walled carbon nanotubes because they have unique mechanical and electronic properties. Defects are less likely to occur in single-walled carbon nanotubes because multi-walled carbon nanotubes can survive occasional defects by forming bridges between unsaturated carbon valances, while single-walled carbon nanotubes have no neighboring walls to compensate for defects. Defect-free single-walled nanotubes are expected to have remarkable mechanical, electronic and magnetic properties that could be tunable by varying the diameter, number of concentric shells, and chirality of the tube.

The carbon nanotubes have interesting properties with regard to magnetoelectronic applications which utilize the spin properties of electrical charge carriers. Tsukagoshi et al "Coherent transport of electron spin in a ferromagnetically contacted carbon nanotube" Nature 401: 572-574 (1999) discloses that carbon nanotubes transport the spin of conduction electrons without a spin flip-over process when conduction electrons are injected into a carbon nanotube. If conduction electrons with polarized spins are injected into a carbon nanotube, for example proceeding from a ferromagnetic conductor, then the spin orientation of the conduction electron is maintained in the carbon nanotube over a path length of approximately 250 nm.

U.S. Pat. No. 6,987,302 to Yingjian Chen and Xiaozhong Dang describes incorporating nanotubes into semiconductor devices, such as transistors, by attaching magnetic nanoparticles to the nanotubes and selecting the magnetic nanotubes based on diameter and length. The patent describes positioning the nanotubes attached to magnetic nanoparticles at the desired locations on the wafers by magnetically assisted assembly.

U.S. Pat. No. 6,809,361 to Wolfgang Honlein and Franz Kreupl describes a magnetic memory unit that has two magnetizable electrodes and a nanotube between the electrodes. Information is stored in the memory unit by setting a magnetization direction in one of the magnetizable electrodes by applying an external magnetic field. The magnetic memory functions by spin-polarizing the electrons in the first magnetizable electrode and transporting the electrodes without any change in the spin state through the nanotube into the second magnetizable electrode.

SUMMARY

The present invention provides methods and processes for making and using magnetic nanotransistors. In one aspect of the invention, at least one magnetic particle can be attached to a nanotube spanning the two fixed magnetic moments, and an external magnetic field can be applied to the magnetic particle. The current through the nanotube depends on the relative orientations of the magnetic moment of the particle that is induced by the external field, and by the magnetic moments of the magnetic contacts.

In one aspect, the invention provides a magnetic nanotransistor, comprising a first magnetizable electrode, a second magnetizable electrode, and at least one nanotube arranged between the first magnetizable electrode and the second magnetizable electrode wherein the nanotube has at least one magnetic particle attached thereto and wherein the magnetic moment of a magnetic particle is reversed by applying an external magnetic field and thereby effects on the spin polarized current that is passing through the nanotube.

These and other aspects of the present invention will become evident upon reference to the following detailed description. In addition, various references are set forth herein which describe in more detail certain procedures or compositions, and are therefore incorporated by reference in their entirety.

DETAILED DESCRIPTION

I. Definitions

Figure 1:
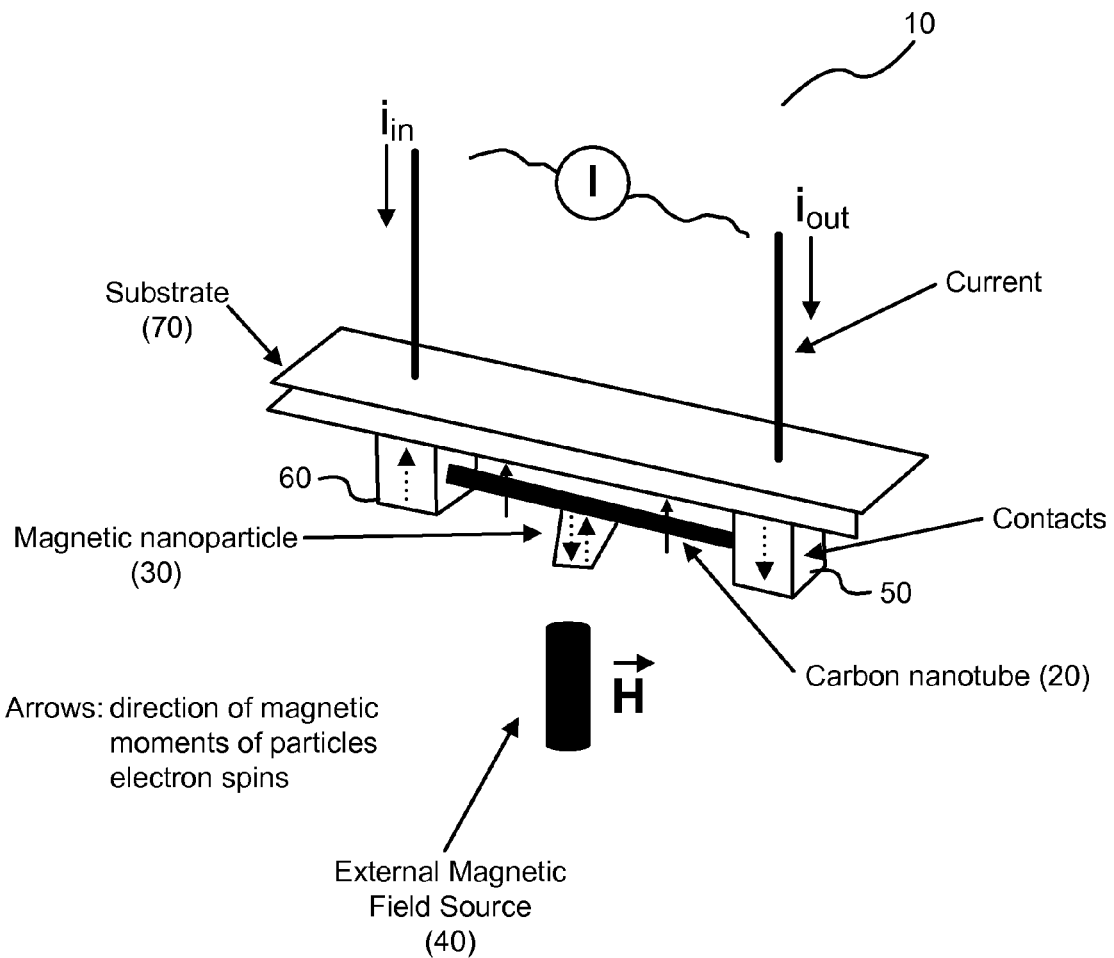
FIG. 1 illustrates an apparatus for carrying out the present invention.

Unless otherwise stated, the following terms used in this application, including the specification and claims, have the definitions given below. It must be noted that, as used in the specification and the appended claims, the singular forms "a," "an" and "the" include plural referents unless the context clearly dictates otherwise. Definition of standard chemistry terms may be found in reference works, including Carey and Sundberg (1992) "Advanced Organic Chemistry $3^{rd}$ Ed." Vols. A and B, Plenum Press, New York, and Cotton et al. (1999) "Advanced Inorganic Chemistry $6^{th}$ Ed." Wiley, New York.

The terms "single-walled carbon nanotube" or "one-dimensional carbon nanotube" are used interchangeable and refer to cylindrically shaped thin sheet of carbon atoms having a wall consisting essentially of a single layer of carbon atoms, and arranged in an hexagonal crystalline structure with a graphitic type of bonding.

The term "multi-walled carbon nanotube" as used herein refers to a nanotube composed of more than one concentric tubes.

The terms "metalorganic" or "organometallic" are used interchangeably and refer to co-ordination compounds of organic compounds and a metal, a transition metal or metal halide.

II. Overview

The present invention discloses methods and processes for producing magnetic nanotransistors containing carbon nanotubes, in particular, single-walled carbon nanotubes (SWNTs). The carbon nanotubes and SWNTs can be produced by any of the known methods, and then deposited on the substrate. Preferably, the nanotube is attached to at least one magnetic particle. As illustrated in FIG. 1, the magnetic nanoparticle containing nanotube (20) is then attached between the two fixed magnetic moments (i.e., at electrodes 50 and 60), and subjected to an external magnetic field (40). The current passing through the nanotube can be controlled using the external magnetic field.

III. Synthesis Carbon Nanotubes

The carbon nanotubes (CNTs) can be multi-walled carbon nanotubes (MWNTs), single-walled carbon nanotubes (SWNTs), double-wall carbon nanotubes, buckytubes, carbon fibrils, and combinations thereof The CNTs can be made by any known technique familiar to those in the art, they can be optionally purified, and they can be metallic, semiconducting, semimetallic, and combinations thereof For example, the nanotubes can be fabricated by the laser ablation method of U.S. Pat. No. 6,280,697, the arc discharge method of Journet et al. Nature 388: 756 (1997), the chemical vapor deposition method where supported metal nanoparticles can be contacted with the carbon source at the reaction temperatures according to the literature methods described in Harutyunyan et al., NanoLetters 2, 525 (2002), and the like. Preferably, the SWNTs are produced by the chemical vapor deposition method.

The chemical vapor deposition (CVD) method for the synthesis of carbon nanotubes uses carbon precursors, such as carbon containing gases. In general, any carbon containing gas that does not pyrolize at temperatures up to 800° C. to 1000° C. can be used. Examples of suitable carbon-containing gases include carbon monoxide, aliphatic hydrocarbons, both saturated and unsaturated, such as methane, ethane, propane, butane, pentane, hexane, ethylene, acetylene and propylene; oxygenated hydrocarbons such as acetone, and methanol; aromatic hydrocarbons such as benzene, toluene, and naphthalene; and mixtures of the above, for example carbon monoxide and methane. In general, the use of acetylene promotes formation of multi-walled carbon nanotubes, while CO and methane are preferred feed gases for formation of single-walled carbon nanotubes. The carbon-containing gas may optionally be mixed with a diluent gas such as hydrogen, helium, argon, neon, krypton and xenon or a mixture thereof.

The catalyst composition for use in CVD can be any catalyst composition known to those of skill in the art. Conveniently, the particles will be of a magnetic metal or alloy, such as, for example, iron, iron oxide, or a ferrite such as cobalt, nickel, chromium, yttrium, hafnium, manganese or their combinations. The particles useful according to the invention will preferably have an average overall particle size of up to 50 nm to about 1 µm, although, in general, the particle sizes for individual particles can be from about 400 nm to about 1 µm.

The function of the catalyst when used in the carbon nanotube growth process is to decompose the carbon precursors and aid the deposition of ordered carbon. The methods and processes of the present invention preferably use metal nanoparticles as the metallic catalyst. The metal or combination of metals selected as the catalyst can be processed to obtain the desired particle size and diameter distribution, and can be separated by being supported on a material suitable for use as a support during synthesis of carbon nanotubes. As known in the art, the support can be used to separate the catalyst particles from each other thereby providing the catalyst materials with greater surface area in the catalyst composition. Such support materials include powders of crystalline silicon, polysilicon, silicon nitride, tungsten, magnesium, aluminum and their oxides, preferably aluminum oxide, silicon oxide, magnesium oxide, or titanium dioxide, or combination thereof, optionally modified by addition elements, are used as support powders. Silica, alumina and other materials known in the art may be used as support, preferably alumina is used as the support.

The metal catalyst can be selected from a Group V metal, such as V or Nb, and mixtures thereof, a Group VI metal including Cr, W, or Mo, and mixtures thereof, VII metal, such as, Mn, or Re, Group VIII metal including Co, Ni, Ru, Rh, Pd, Os, Ir, Pt, and mixtures thereof, or the lanthanides, such as Ce, Eu, Er, or Yb and mixtures thereof, or transition metals such as Cu, Ag, Au, Zn, Cd, Sc, Y, or La and mixtures thereof Specific examples of mixture of catalysts, such as bimetallic catalysts, which may be employed by the present invention include Co—Cr, Co—W, Co—Mo, Ni—Cr, Ni—W, Ni—Mo, Ru—Cr, Ru—W, Ru—Mo, Rh—Cr, Rh—W, Rh—Mo, Pd—Cr, Pd—W, Pd—Mo, Ir—Cr, Pt—Cr, Pt—W, and Pt—Mo. Preferably, the metal catalyst is iron, cobalt, nickel, molybdenum, or a mixture thereof, such as Fe—Mo, Co—Mo and Ni—Fe—Mo.

The metal, bimetal, or combination of metals are used to prepare metal nanoparticles having defined particle size and diameter distribution. The catalyst nanoparticles can be prepared by thermal decomposition of the corresponding metal salt added to a passivating solvent, and the temperature of the solvent adjusted to provide the metal nanoparticles, as described in the co-pending and co-owned U.S. patent application Ser. No. 10/304,316, or by any other method known in the art. The particle size and diameter of the metal nanoparticles can be controlled by using the appropriate concentration of metal in the passivating solvent and by controlling the length of time the reaction is allowed to proceed at the thermal decomposition temperature. The metal salt can be any salt of the metal, and can be selected such that the salt is soluble in the solvent and/or the melting point of the metal salt is lower than the boiling point of the passivating solvent. Thus, the metal salt contains the metal ion and a counter ion, where the counter ion can be nitrate, nitrite, nitride, perchlorate, sulfate, sulfide, acetate, halide, oxide, such as methoxide or ethoxide, acetylacetonate, and the like. For example, the metal salt can be iron acetate ($FeAc_2$), nickel acetate ($NiAc_2$), palladium acetate ($PdAc_2$), molybdenum acetate ($MoAc_3$), and the like, and combinations thereof The melting point of the metal salt is preferably about 5° C. to 50° C. lower than the boiling point, more preferably about 5° C. to about 20° C. lower than the boiling point of the passivating solvent. The solvent can be an ether, such as a glycol ether, 2-(2-butoxyethoxy)ethanol, $H(OCH_2CH_2)_2O(CH_2)_3CH_3$, which will be referred to below using the common name dietheylene glycol mono-n-butyl ether, and the like.

Preferably, the support material is added to the reaction mixture containing the metal salt. The support material can be added as a solid, or it can be first dissolved in the passivating solvent and then added to the solution containing the metal salt. The solid support can be silica, alumina, MCM-41, MgO, $ZrO_2$, aluminum-stabilized magnesium oxide, zeolites, or other supports known in the art, and combinations thereof For example, $Al_2O_3$—$SiO_2$ hybrid support could be used. Preferably, the support material is soluble in the passivating solvent. In one aspect, the counterion of the metal salt and the support material is the same, thus, for example, nitrites can be the counterion in the metal salt and in the support material. Thus, the support material contains the element of the support material and a counter ion, where the counter ion can be nitrate, nitrite, nitride, perchlorate, sulfate, sulfide, acetate, halide, oxide, such as methoxide or ethoxide, acetylacetonate, and the like. Thus, for example, nitrites can be the counterion in metal ions (ferrous nitrite) and in the support material (aluminum nitrite), or the support can be aluminum oxide ($Al_2O_3$) or silica ($SiO_2$). The support material can be powdered thereby providing small particle sizes and large surface areas. The powdered support material can preferably have a particle size between about 0.01 μm to about 100 μm, more preferably about 0.1 μm to about 10 μm, even more preferably about 0.5 μm to about 5 μm, and most preferably about 1 μm to about 2 μm. The powdered support material can have a surface area of about 50 to about 1000 $m^2/g$, more preferably a surface area of about 200 to about 800 $m^2/g$. The powdered oxide can be freshly prepared or commercially available. For example, a suitable $Al_2O_3$ powder with 1-2 μm particle size and having a surface area of 300-500 $m^2/g$ is commercially available from Alfa Aesar of Ward Hill, Mass., or Degussa, N.J. Powdered oxide can be added to achieve a desired weight ratio between the powdered oxide and the initial amount of metal used to form the metal nanoparticles. Typically, the weight ratio can be between about 10:1 and about 15:1. For example, if 100 mg of iron acetate is used as the starting material, then about 320 to 480 mg of powdered oxide can be introduced into the solution. The weight ratio of metal nanoparticles to powdered oxide can be between about 1:1 and 1:10, such as, for example, 1:1, 2:3, 1:4, 3:4, 1:5, and the like.

After forming a homogenous mixture, metal nanoparticles are formed during the thermal decomposition. The thermal decomposition reaction is started by heating the contents of the reaction vessel to a temperature above the melting point of at least one metal salt in the reaction vessel. The average particle size of the metal nanoparticles can be controlled by adjusting the length of the thermal decomposition. Typical reaction times range from about 20 minutes to about 2400 minutes, depending on the desired nanoparticle size. Metal nanoparticles having an average particle size of about 0.01 nm to about 20 nm, more preferably about 0.1 nm to about 3 nm and most preferably about 0.3 nm to 2 nm can be prepared. The metal nanoparticles can thus have a particle size of 0.1, 1, 2, 3, 4, 5, 6, 7, 8, 9, or 10 nm, and up to about 20 nm. In another aspect, the metal nanoparticles can have a range of particle size, or diameter distribution. For example, the metal nanoparticles can have particle sizes in the range of about 0.1 nm and about 5 nm in size, about 3 nm and about 7 nm in size, or about 5 nm and about 11 nm in size.

In one aspect of the invention, the diameter distribution of the synthesized SWNTs is substantially uniform. Thus, about 90% of the SWNTs have a diameter within about 25% of the mean diameter, more preferably, within about 20% of the mean diameter, and even more preferably, within about 15% of the mean diameter. Thus, the diameter distribution of the synthesized SWNTs can be about 10% to about 25% within the mean diameter, more preferably about 10% to about 20% of the mean diameter, and even more preferably about 10% to about 15% of the mean diameter.

In one aspect, the prepared nanotube sample can be composed of a mixture of metallic-type carbon SWNTs and semiconducting-type carbon SWNTs. The nanotube sample may be of any size that is convenient for processing within the microwave cavity. In an embodiment, the prepared nanotube sample weighs approximately 100 mg. In another embodiment, the prepared nanotube sample weighs between about 10 milligrams and 10 grams.

In another aspect, the prepared carbon nanotube sample can contain additional materials formed during synthesis of the carbon nanotubes, such as amorphous carbon created as a reaction byproduct during synthesis of carbon nanotubes by CVD or laser vaporization. Further, the SWNTs can contain materials added to facilitate carbon nanotube synthesis, such as metal nanoparticles used as a growth catalyst. In still another embodiment, the prepared carbon nanotube sample may contain low levels of additional materials, such as trace levels of metals or other impurities.

In another aspect, the SWNTs can be optionally further treated to remove catalyst nanoparticles. For example, SWNTs synthesized by CVD growth on a growth catalyst composed of metal nanoparticles can optionally be treated with an acid to remove the metal nanoparticles.

The carbon nanotubes thus produced can be attached to magnetic nanoparticles using any of the methods known in the art. For example, the carbon nanotubes can be treated with an acid, such as, $H_2SO_4$—$HNO_3$ solution, to activate the surface. The acid-treatment is used to generate carboxyl, carbonyl, hydroxyl, or sulfate groups on the surface of the carbon nanotubes. These reactive groups can then be exposed to a cationic polyelectrolyte. The reactive groups and the cationic polyelectrolyte electrostatically interact with each other resulting in the adsorption of charged polyelectrolyte. The nanotubes are subsequently exposed to negatively charged colloidal magnetic nanoparticles, which are anchored to the surface of the nanotubes through the electrostatic interaction. Another alternative approach uses acetone-activated nanotubes. The hydrophobic interactions between the methyl termini of the acetone $CH_3$ and the alkyl chains of octanethiols capped magnetic nanoparticles provide the hydrophobic anchorage.

IV. Carbon Nanotubes as Magnetic Nanotransistors

The carbon nanotubes with attached magnetic particles synthesized above can be used in magnetic nanotransistors described below with reference to FIG. 1. The substrate 70 can be a solid substrate, such as glass, mica, silicon, fiberglass, Teflon, ceramics, plastic (including acrylics, polystyrene and copolymers of styrene and other materials, polypropylene, polyethylene, polybutylene, polycarbonate, polyurethanes, and the like), and quartz. The substrate can have any shape, such a rectangular, circular, rambazoid, square, and the like.

The magnetic nanotransistor 10 has a first magnetizable electrode 50, a second magnetizable electrode 60 and a nanotube 20, which is arranged between the electrodes 50, 60 in the longitudinal direction and which is coupled to the first electrode and to the second electrode. The nanotube 20 is preferably a carbon nanotube. The nanotube 20 is set up in such a way that the spin state of electrons which flow between the two electrodes 50, 60 are at least partly preserved during passage through the nanotube.

The first electrode 50 has a first magnetic material and the second electrode 60 has as second magnetic material. The first and the second magnetic material can be the same or can be different can be made from any material known, such as for example cobalt, iron, nickel, iron-nickel alloy, and the like. Thus, the two electrodes can be magnetizable or can remain permanently in a magnetization state. The two electrodes 50, 60 can be arranged at a distance "d" from one another. Preferably, the distance "d" is selected such that the spin-polarized conduction of the electron can be transported over the length of the nanotube without a spin flip-over process, so that the spin information of the conduction electron is preserved when passing through the nanotube 20. Thus, the distance d corresponds to the length of the nanotube 20 and the value of d can be between 0.5 μm and 5 μm, preferably between 1 μm and 4 μm, more preferably between 1 μm and 2 μm, and the like.

The arrows in FIG. 1 show the magnetic moment of the particles. The injected polarized electrons can be transported over carbon nanotube while preserving the spin information of the electron. However, an external magnetic field source can be brought in close proximity of the magnetic particles that are attached to the carbon nanotube. The distance between the external magnetic field and the magnetic particle attached to the carbon nanotube can be selected such the magnetic moment of the particle can be affected. Thus, the distance can be about 1 nm to about 1 cm or any distance in between. The application of the external magnetic field to the carbon nanotube having a magnetic nanoparticle attached thereto can reverse the spin or flip-over the electron being transported as is passes through the nanotube. Thus, the apparatus can be used for external control of the current through the nanotube by using magnetic fields.

While the invention has been particularly shown and described with reference to a preferred embodiment and various alternate embodiments, it will be understood by persons skilled in the relevant art that various changes in form and details can be made therein without departing from the spirit and scope of the invention. All printed patents and publications referred to in this application are hereby incorporated herein in their entirety by this reference.

I claim:

1. A magnetic nanotransistor, comprising:
   a first magnetizable electrode;
   a second magnetizable electrode;
   and at least one nanotube arranged between the first magnetizable electrode and the second magnetizable electrode wherein the nanotube has at least one magnetic particle attached thereto and wherein the magnetic moment of the particle is capable of being reversed by application of an external magnetic field.

2. The magnetic nanotransistor unit of claim 1, wherein the nanotube is a carbon nanotube.

3. The magnetic nanotransistor unit of claim 2, wherein the carbon nanotube is a single-walled carbon nanotube, a multi-walled carbon nanotube, or a combination thereof.

4. The magnetic nanotransistor unit of claim 1, wherein the first magnetizable electrode and the second magnetizable electrode are arranged at a distance of 1 nm to 300 nm from one another.

5. The magnetic nanotransistor unit of claim 2, wherein the carbon nanotube is a single-walled carbon nanotube.

6. The magnetic nanotransistor unit of claim 1, wherein the first magnetizable electrode and the second magnetizable electrode are arranged at a distance sufficient to enable a conduction electron passing through the nanotube to preserve its spin state.

7. The magnetic nanotransistor unit of claim 1, wherein the first magnetizable electrode and the second magnetizable electrode are each permanently magnetized.

8. The magnetic nanotransistor unit of claim 1, wherein the first magnetizable electrode and the second magnetizable electrode are each intermittently magnetized.

9. The magnetic nanotransistor unit of claim 1, wherein the nanotube is arranged longitudinally between the first magnetizable electrode and the second magnetizable electrode.

10. The magnetic nanotransistor unit of claim 1, wherein the first magnetizable electrode and the second magnetizable electrode comprise the same magnetic material.

11. The magnetic nanotransistor unit of claim 1, wherein the first magnetizable electrode and the second magnetizable electrode comprise different magnetic materials.

12. The magnetic nanotransistor unit of claim 10, wherein the magnetic material of the first magnetizable electrode and the second magnetizable electrode is selected from the group consisting of cobalt, iron, nickel, and a combination thereof.

13. The magnetic nanotransistor unit of claim 11, wherein the magnetic material of the first magnetizable electrode and the magnetic material of the second magnetizable electrode are each independently selected from the group consisting of cobalt, iron, nickel, and a combination thereof.

14. A method of using a magnetic nanotransistor, the method comprising:
   providing a magnetic nanotransistor, wherein the magnetic nanotransistor comprises a first magnetizable electrode; a second magnetizable electrode; and at least one nanotube arranged between the first magnetizable electrode and the second magnetizable electrode, and wherein the nanotube has at least one magnetic particle attached thereto, and wherein the magnetic moment of the particle is capable of being reversed by applying an external magnetic field; and
   controlling the current through the nanotube by selectively applying an external magnetic field to the magnetic particle at a distance from the magnetic particle sufficient to alter the magnetic moment of the magnetic particle.

15. The method of claim 14, wherein the magnetic field is applied at a distance of between 1 nm to 1 cm from the magnetic particle.

16. The method of claim 14, wherein the magnetic field reverses the spin of a conduction electron passing through the nanotube.

17. The method of claim 14, wherein the magnetic field produces a spin flip-over in a conduction electron passing through the nanotube.

18. The method of claim 14, wherein the first magnetizable electrode and the second magnetizable electrode are each permanently magnetized.

19. The method of claim 14, wherein the first magnetizable electrode and the second magnetizable electrode are each intermittently magnetized.

20. The magnetic nanotransistor unit of claim 1, wherein the first magnetizable electrode and the second magnetizable electrode are arranged at a distance of 0.5 μm to 5 μm from one another.

21. The magnetic nanotransistor unit of claim 20, wherein the first magnetizable electrode and the second magnetizable electrode are arranged at a distance of 1 μm to 4 μm from one another.

22. The magnetic nanotransistor unit of claim 20, wherein the first magnetizable electrode and the second magnetizable electrode are arranged at a distance of 1 μm to 2 μm from one another.

* * * * *

UNITED STATES PATENT AND TRADEMARK OFFICE
CERTIFICATE OF CORRECTION

PATENT NO. : 8,093,669 B2
APPLICATION NO. : 12/463557
DATED : January 10, 2012
INVENTOR(S) : Avetik Harutyunyan It is certified that error appears in the above-identified patent and that said Letters Patent is hereby corrected as shown below:

Column 7, line 33, after "moment of the," insert -- magnetic --.

Signed and Sealed this
First Day of May, 2012

David J. Kappos
*Director of the United States Patent and Trademark Office*